US010211830B2

(12) United States Patent
Brindle et al.

(10) Patent No.: US 10,211,830 B2
(45) Date of Patent: Feb. 19, 2019

(54) SHUNT TERMINATION PATH

(71) Applicant: QUALCOMM Incorporated, San Diego, CA (US)

(72) Inventors: Christopher Nelles Brindle, Poway, CA (US); Jingbo Wang, San Jose, CA (US); Pasi Tapani Tikka, Parnu (EE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/581,592

(22) Filed: Apr. 28, 2017

(65) Prior Publication Data

US 2018/0316350 A1    Nov. 1, 2018

(51) Int. Cl.
| H03K 17/16 | (2006.01) |
| H03K 19/003 | (2006.01) |
| H03K 19/00 | (2006.01) |
| H03K 17/687 | (2006.01) |

(52) U.S. Cl.
CPC ....... H03K 19/0005 (2013.01); H03K 17/687 (2013.01)

(58) Field of Classification Search
None
See application file for complete search history.

(56) References Cited

U.S. PATENT DOCUMENTS

| 4,132,865 A | 1/1979 | Szechenyi |
| 5,043,672 A | 8/1991 | Youn |
| 5,808,502 A | 9/1998 | Hui et al. |
| 5,818,099 A | 10/1998 | Burghartz |
| 6,094,088 A | 7/2000 | Yano |
| 6,108,526 A | 8/2000 | Van Der Plas |
| 6,400,252 B1 | 6/2002 | Smith et al. |

(Continued)

FOREIGN PATENT DOCUMENTS

| CN | 1792034 A | 6/2006 |
| CN | 101217252 A | 7/2008 |

(Continued)

OTHER PUBLICATIONS

Huang, et al., "Novel double pole double throw switchplexer that simplifies dual-band WLAN and MIMO front-end module designs," Microwave Symposium Digest, 2008 IEEE MTT-S International, Jun. 15-20, 2008, pp. 1183-1186.

(Continued)

Primary Examiner — Anh Q Tran
(74) Attorney, Agent, or Firm — Haynes and Boone, LLP

(57) ABSTRACT

Certain aspects of the present disclosure generally relate to electronic circuits and, more particularly, to a switch architecture including a shunt termination path, for example to provide isolation between two terminals. More particularly, aspects of the present disclosure relate to methods for operating a shunt path to achieve various termination states. An exemplary method generally includes providing a first control signal to a plurality of transistors coupled in series between an electrical path and a termination transistor, wherein the termination transistor is coupled in series between the plurality of transistors and ground, providing a second control signal to the termination transistor, and dynamically controlling the first and second control signals to achieve a desired termination state for the electrical path.

26 Claims, 8 Drawing Sheets

(56) References Cited

U.S. PATENT DOCUMENTS

| | | |
|---|---|---|
| 6,713,991 B1 | 3/2004 | McCallum |
| 6,803,680 B2 | 10/2004 | Brindle et al. |
| 6,804,502 B2 | 10/2004 | Burgener et al. |
| 6,836,172 B2 | 12/2004 | Okashita |
| 6,870,241 B2 | 3/2005 | Nakatani et al. |
| 6,978,149 B1 | 12/2005 | Morelli et al. |
| 7,088,971 B2 | 8/2006 | Burgener et al. |
| 7,106,121 B2 | 9/2006 | Hidaka et al. |
| 7,173,471 B2 | 2/2007 | Nakatsuka et al. |
| 7,199,635 B2 | 4/2007 | Nakatsuka et al. |
| 7,205,817 B1 | 4/2007 | Huang et al. |
| 7,236,044 B2 | 6/2007 | Talwalkar et al. |
| 7,263,337 B2 | 8/2007 | Struble |
| 7,345,521 B2 | 3/2008 | Takahashi et al. |
| 7,459,988 B1 | 12/2008 | Iversen |
| 7,642,859 B2 | 1/2010 | Shimada |
| 7,659,770 B2 | 2/2010 | Teraguchi et al. |
| 7,679,417 B2 | 3/2010 | Vice |
| 7,843,280 B2 | 11/2010 | Ann et al. |
| 7,848,712 B2 | 12/2010 | Fu et al. |
| 7,877,058 B2 | 1/2011 | Prikhodko et al. |
| 8,058,922 B2 | 11/2011 | Cassia |
| 8,395,435 B2 | 3/2013 | Cassia et al. |
| 8,618,860 B2 | 12/2013 | Lam et al. |
| 8,975,947 B1 * | 3/2015 | Seshita ............... H03K 17/162 327/379 |
| 9,209,784 B2 | 12/2015 | Iversen et al. |
| 9,531,359 B1 * | 12/2016 | Shrivastava ............. H03K 5/08 |
| 2001/0040479 A1 | 11/2001 | Zhang |
| 2001/0050951 A1 | 12/2001 | Dellon et al. |
| 2005/0014473 A1 | 1/2005 | Zhao et al. |
| 2006/0199563 A1 | 9/2006 | Kelly et al. |
| 2006/0267666 A1 | 11/2006 | Toda |
| 2007/0049237 A1 | 3/2007 | Miura et al. |
| 2007/0069291 A1 | 3/2007 | Stuber et al. |
| 2007/0222523 A1 | 9/2007 | Arell |
| 2007/0281629 A1 | 12/2007 | Ahn et al. |
| 2008/0064358 A1 | 3/2008 | Sagae et al. |
| 2008/0290928 A1 | 11/2008 | Kawakyu et al. |
| 2009/0067478 A1 | 3/2009 | Au et al. |
| 2009/0291645 A1 | 11/2009 | Chu et al. |
| 2010/0069020 A1 | 3/2010 | Koya et al. |
| 2010/0117713 A1 | 5/2010 | Katoh et al. |
| 2011/0001544 A1 | 1/2011 | Ranta et al. |
| 2011/0025403 A1 | 2/2011 | Cassia |
| 2011/0025404 A1 | 2/2011 | Cassia |
| 2011/0148503 A1 | 6/2011 | Granger-Jones et al. |
| 2011/0260774 A1 | 10/2011 | Granger-Jones et al. |
| 2011/0260780 A1 | 10/2011 | Granger-Jones et al. |
| 2016/0126934 A1 | 5/2016 | De |
| 2016/0126943 A1 | 5/2016 | Bacon |

FOREIGN PATENT DOCUMENTS

| | | |
|---|---|---|
| DE | 102008004861 | 7/2009 |
| JP | S6468664 A | 3/1989 |
| JP | H10242826 A | 9/1998 |
| JP | 2000249728 A | 9/2000 |
| JP | 2001217701 A | 8/2001 |
| JP | 2006526374 A | 11/2006 |
| JP | 20063372778 A | 12/2006 |
| JP | 2008011120 A | 1/2008 |
| JP | 2008270964 A | 11/2008 |
| JP | 2008294726 A | 12/2008 |
| JP | 2009065304 A | 3/2009 |
| WO | 2004105243 A2 | 12/2004 |
| WO | 2008056747 A1 | 5/2008 |

OTHER PUBLICATIONS

International Preliminary Report on Patentability—PCT/US2010/043593, The International Bureau of WIPO—Geneva, Switzerland, Feb. 9, 2012 (092971WO).

International Search Report and Written Opinion—PCT/US2010/043596, International Search Authority—European Patent Office—dated Sep. 23, 2010 (092915).

International Search Report and Written Opinion—PCT/US2010/044032, International Search Authority—European Patent Office—dated Oct. 8, 2010 (093060).

International Search Report and Written Opinion—PCT/US2010/043593, International Search Authority—European Patent Office—dated Apr. 5, 2011 (092971WO).

Jones S, "Reduce Insertion Loss in Gaas FET RF Switch Using Negative Voltage Derived From RF Output", Motorola Technical Developments, Motorola Inc. Schaumburg, Illinois, US, vol. 41, May 1, 2000 (May 1, 2000), p. 205/206, XP001096807, ISSN: 0887-5286.

Miyatsuji K., et al., "A GaAs High Power RF Single Pole Dual Throw Switch IC for Digital Mobile Communication System", IEEE Journal of Solid-State Circuits, IEEE Service Center, Piscataway, NJ, USA, vol. 30, No. 9, Sep. 1, 1995 (Sep. 1, 1995), pp. 979-983, XP000526204, ISSN: 0018-9200, DOI: 10.1109/4.406396.

Numata K, et al., "A high-power-handling Gsm switch IC with new adaptive-control-voltage-generator circuit scheme" 2003 IEEE Radio Frequency Integrated Circuits (RFIC) Symposium. Digest of Papers. Philadelphia, PA, Jun. 8-10, 2003- [IEEE Radio Frequency Integrated Circuits Symposium], New York, Ny: IEEE, US, Jun. 8, 2003 (Jun. 8, 2003), pp. 233-236, XP010646700, DOI: D0I:10.1109/RFIC.2003.1213933 ISBN: 978-0-7803-7694-6.

* cited by examiner

SHUNT TERMINATION PATH

TECHNICAL FIELD

Certain aspects of the present disclosure generally relate to electronic circuits and, more particularly, to a switch architecture including a shunt termination path.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

In order to transmit data and/or control information, the radio frequency front end of the base station and/or the mobile station may generate and transmit radio frequency (RF) signals, for example, via one or more antennas. A power amplifier (PA) may amplify these RF signals. In order to selectively transmit the amplified RF signals on the antennas, the PA may be selectively electrically coupled to or isolated from one or more of the antennas via a switching architecture. Switches and switching architectures may also be used in other locations within the base station and/or mobile station and/or in other devices.

SUMMARY

Certain aspects of the present disclosure generally relate to a shunt termination path for providing isolation between two terminals.

Certain aspects of the present disclosure provide a method for operating an electrical circuit. An exemplary method generally includes providing a first control signal to a plurality of transistors coupled in series between an electrical path and a termination transistor, wherein the termination transistor is coupled in series between the plurality of transistors and ground, providing a second control signal to the termination transistor, and dynamically controlling the first and second control signals to achieve a desired termination state for the electrical path.

Certain aspects of the present disclosure provide an apparatus for operating an electrical circuit. The apparatus generally includes at last one processor configured to provide a first control signal to a plurality of transistors coupled in series between an electrical path and a termination transistor, wherein the termination transistor is coupled in series between the plurality of transistors and ground, provide a second control signal to the termination transistor, and dynamically control the first and second control signals to achieve a desired termination state for the electrical path. The apparatus also generally includes a memory coupled with the at least one processor.

Certain aspects of the present disclosure provide an apparatus for operating an electrical circuit. The apparatus generally includes means for providing a first control signal to a plurality of transistors coupled in series between an electrical path and a termination transistor, wherein the termination transistor is coupled in series between the plurality of transistors and ground, means for providing a second control signal to the termination transistor, and means for dynamically controlling the first and second control signals to achieve a desired termination state for the electrical path.

Certain aspects of the present disclosure provide a non-transitory computer-readable medium for operating an electrical circuit. The non-transitory computer-readable medium generally includes instructions for providing a first control signal to a plurality of transistors coupled in series between an electrical path and a termination transistor, wherein the termination transistor is coupled in series between the plurality of transistors and ground, providing a second control signal to the termination transistor, and dynamically controlling the first and second control signals to achieve a desired termination state for the electrical path.

Certain aspects of the present disclosure provide an apparatus. The apparatus may include an electrical path, a first plurality of transistors coupled to the electrical path, and a termination transistor. The plurality of transistors may be coupled in series between the electrical path and the termination transistor, and the termination transistor may be coupled in series between the plurality of transistors and ground. The apparatus may further include a source of a first control signal configured to be selectively applied to gates of the plurality of transistors, and a source of a second control signal configured to be selectively applied to a gate of the termination transistor. The first and second control signals may be dynamically controllable to achieve a desired termination state for the electrical path.

Certain aspects of the present disclosure provide a switch. The switch may include a stack of transistors in shunt with a signal path and a plurality of resistors. Each resistor may be coupled between a source and a drain of a respective transistor in the stack of transistors. The switch may further comprise a terminating impedance selectively coupled between the stack of transistors and ground. The terminating impedance may be selectively coupled between the stack of transistors and ground independent of any control of the stack of transistors.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
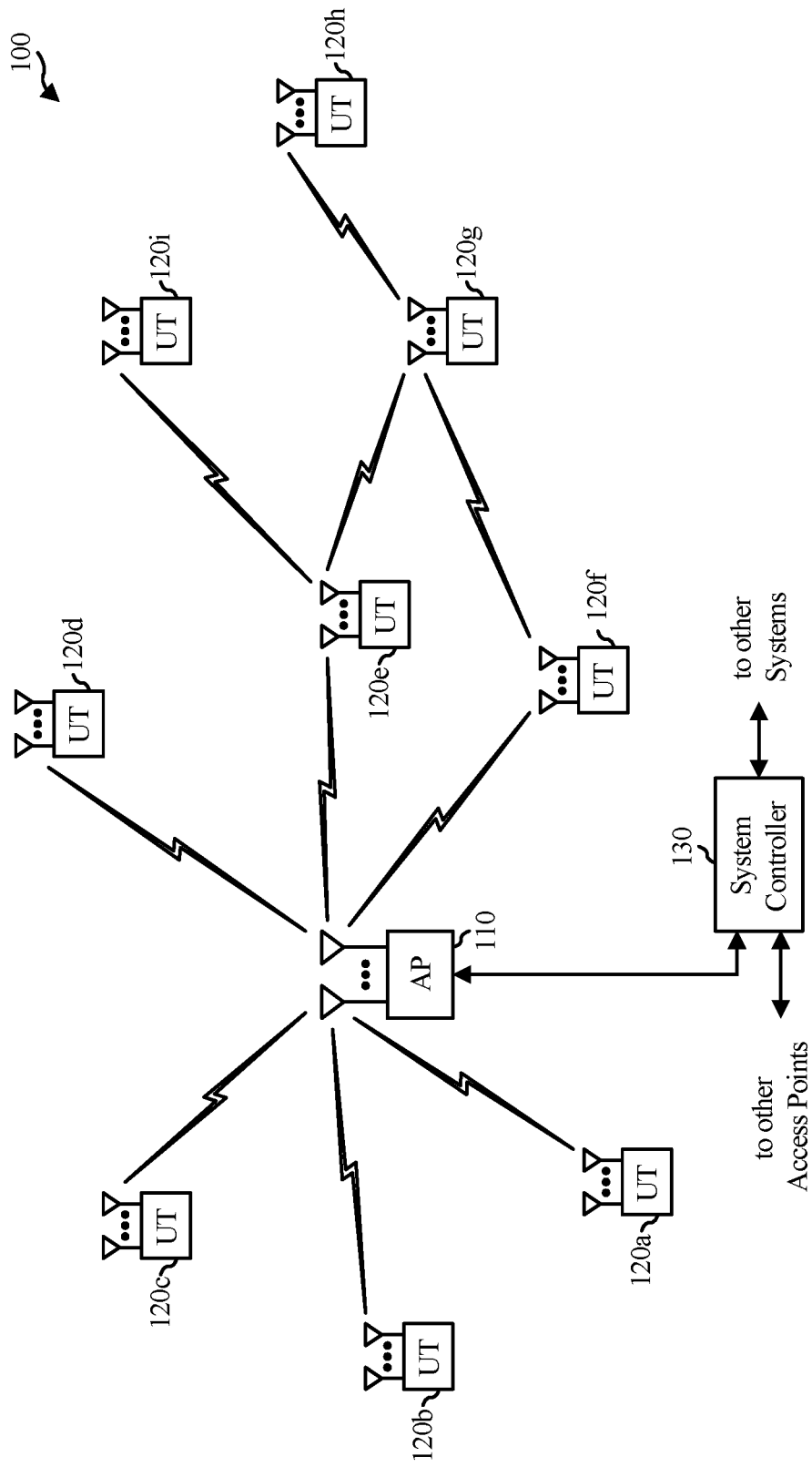
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include a power amplifier for selectively amplifying signals transmitted on antennas. The access point 110 and/or user terminal 120 may further utilize a switching architecture to selectively couple or isolate the antennas to the power amplifier, in accordance with certain aspects of this disclosure. In particular, the switching architecture may include a shunt termination path for providing isolation between two terminals (e.g., an output of the power amplifier and an antenna), in accordance with certain aspects of this disclosure.

Figure 2:
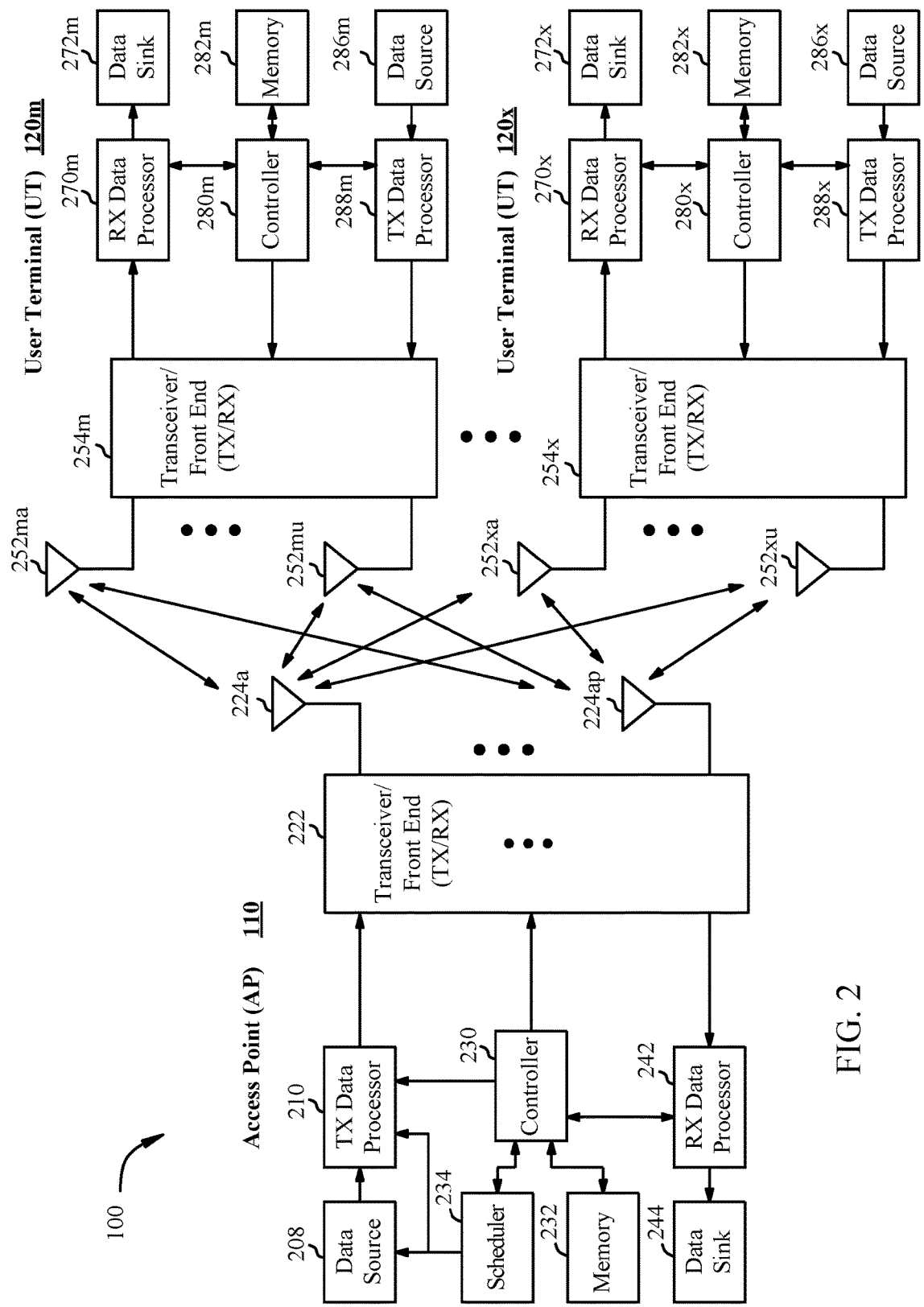
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. In some embodiments, the access point 110 is instead implemented as a base station. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals may be selected for simultaneous transmission on the uplink, $N_{dn}$ user terminals may be selected for simultaneous transmission on the downlink, $N_{up}$ may or may not be equal to $N_{dn}$, and $N_{up}$ and $N_{dn}$ may be static values or can change for each scheduling interval. Beamsteering or some other spatial processing technique may be used at the access point, base station, and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver/front end (TX/RX) 254 (also known as a radio frequency front end (RFFE)) receives and processes (e.g., converts to analog, amplifies, filters, and frequency upconverts) a respective symbol stream to generate an uplink signal. The transceiver/front end 254 may also route the uplink signal to one of the $N_{ut,m}$ antennas for transmit diversity via an RF switch, for example. The RF switch may be part of switching architecture that includes a shunt termination path, for example for providing isolation between two terminals (e.g., an output of the transceiver/front end 254 and one or more of the $N_{ut,m}$ antennas), in accordance with certain aspects of this disclosure. A switch or switching architecture, for example that includes a shunt termination path in accordance with certain aspects of this disclosure, may be implemented elsewhere in the transceiver/front end 254 and/or within the device. The controller 280 may control the routing (e.g., switches of the switching architecture) within the transceiver/front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver/front end 222 may select signals received from one of the antennas 224 for processing. The signals received from multiple antennas 224 may be combined for enhanced receive diversity. The access point's transceiver/front end 222 also performs processing complementary to that performed by the user terminal's transceiver/front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver/front end (TX/RX) 222 of access point 110 and/or transceiver/front end 254 of user terminal 120 may utilize a switching architecture that includes a shunt termination path, for exampled for providing isolation between two terminals (e.g., a terminal of the transceiver front/end 254 or transceiver front/end 222 and one or more antennas).

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver/front end 222 receives and processes (e.g., converts to analog, amplifies, filters, and frequency upconverts) the symbol stream to generate a downlink signal. The transceiver/front end 222 may also route the downlink signal to one or more of the $N_{ap}$ antennas 224 for transmit diversity via an RF switch, for example. The RF switch may be part of switching architecture that includes a shunt termination path for providing isolation between two terminals (e.g., an output of the transceiver/front end 222 and one or more of the $N_{ap}$ antennas 224), in accordance with certain aspects of this disclosure. The controller 230 may control the routing (e.g., switches of the switching architecture) within the transceiver/front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver/front end 254 may select signals received from one of the antennas 252 for processing. The signals received from multiple antennas 252 may be combined for enhanced receive diversity. The user terminal's transceiver/front end 254 also performs processing complementary to that performed by the access point's transceiver/front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof, among other systems/schemes.

Figure 3:
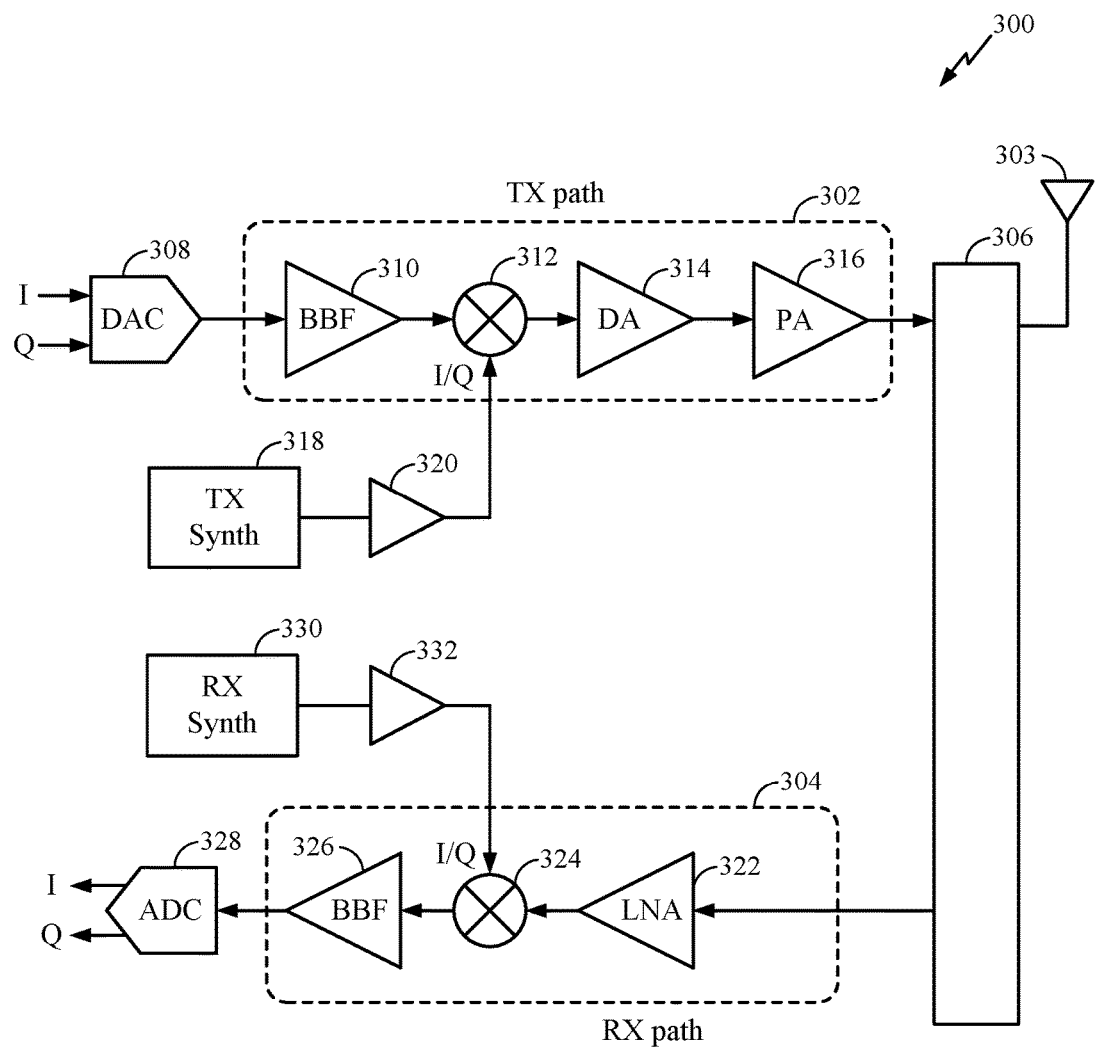
FIG. 3 is a block diagram of an example transceiver/front end, in accordance with certain aspects of the present disclosure.

FIG. 3 is a block diagram of an example transceiver/front end 300, such as transceiver/front ends 222, 254 in FIG. 2, in accordance with certain aspects of the present disclosure. The transceiver/front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303. In particular, the interface 306 may include a switching architecture including one or more shunt paths to selectively couple one or more antennas 303 (e.g., a load) to the PA 316 (e.g., a source), in accordance with certain aspects of this disclosure.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Example Shunt Termination Path

Switch architectures for RF circuits (such as illustrated in FIG. 3) may use one or more shunt termination FET switches in series with a fixed termination resistance to form a termination path to a reference potential (e.g., ground) for unused ports. For example, as noted above, a transceiver and/or front end of an access point, base station, and/or user terminal may comprise switching architecture for selectively coupling a first terminal (e.g., a source, such as a power amplifier) to a second terminal (e.g., a load, such as an antenna). In some cases, the switching architecture may include a shunt path to increase isolation between the terminals, for example, to prevent damage to either electrical terminal when one of them is under fault conditions.

Shunt paths achieve isolation improvement by terminating an isolated path to a reference potential (e.g., ground). Some applications of shunt paths use a matched impedance to the reference potential rather than a short (e.g., to reduce signal reflections). For example, if a system characteristic impedance of the two terminals is 50 Ohms, then the desired impedance on the shunt path should be 50 Ohms as well. In other applications, the shunt path provides different operating states, for example, as described in greater detail below.

Figure 4:
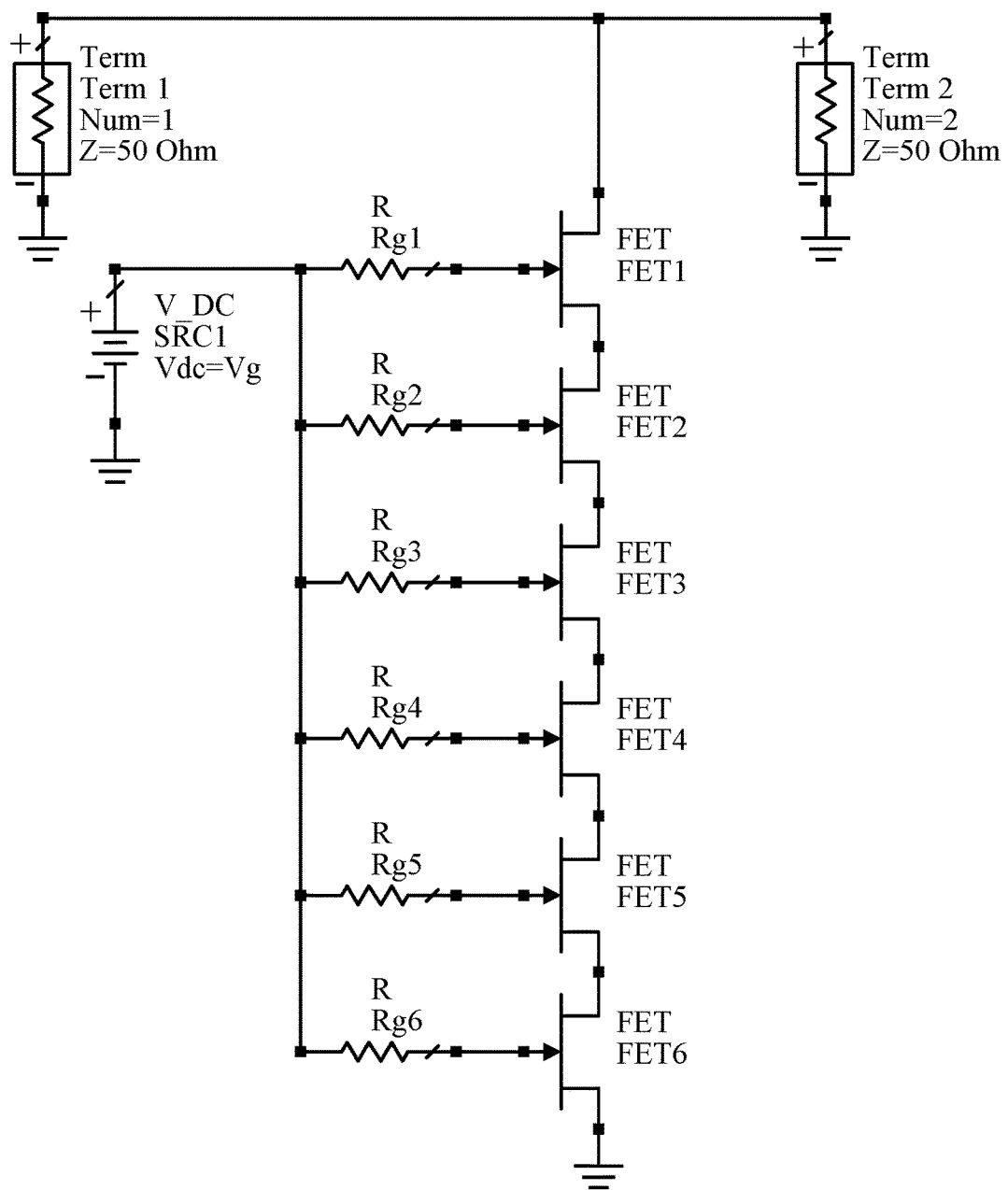
FIG. 4 illustrates a first shunt path circuit configuration for providing isolation between two terminals, in accordance with certain aspects of the present disclosure.

FIG. 4 illustrates a first shunt path circuit configuration for providing isolation between two terminals, according to certain aspects of the present disclosure. In some cases, a first terminal, Term1, may comprise a source terminal (e.g., a power amplifier) and a second terminal, Term2, may comprise a load terminal (e.g., an antenna). Term1 and Term2 are coupled by a signal path (e.g., an isolated path). As illustrated, the shunt path comprises a stack of transistors, illustrated in FIG. 4 as field effect transistors (FETs) FET1-FET6 (e.g., a shunt stack), coupled to the signal path going between the source terminal/port (Term 1), having a 50 Ohm source impedance, to the load terminal/port (Term 2) having a 50 Ohm load impedance. The shunt stack is further coupled to a reference potential (e.g., ground). For example, the source terminal of FET1 is coupled to the signal path and the drain terminal of FET1 is coupled to the source terminal of FET2. The FETs of the shunt stack are further coupled source terminal to drain terminal, until the last FET of the shunt stack, FET6, where the drain terminal of FET6 is coupled to the reference potential. Accordingly, the shunt stack can selectively provide a path to the reference potential for the signal path between Term1 and Term2.

Further, as shown, the gate terminal of each FET device (e.g., FET1-FET6) is coupled to a resistor (e.g., Rg1-Rg6), which is further coupled to a direct current (DC) bias voltage, Vg. In some aspects, the shunt stack may include more or less FETs. The DC bias voltage Vg is supplied by a voltage source SRC1 (e.g., power source). In certain aspects, the values of the gate resistors Rg are selected such that each have much higher impedance at high frequencies than the impedance of the MOS capacitance of the corresponding FET coupled at the gate terminal at high frequencies. Accordingly, the resistors Rg provide a high impedance connection to the gate terminals of the FETs at high frequencies, which may provide high frequency isolation to SRC1. At low frequencies (e.g., DC), the impedance of the Rg resistors may be negligible, which allows the FETs in the shunt stack to be opened or closed (e.g, biased ON or OFF) depending on Vg.

According to certain aspects, the drain-to-gate and gate-to-source capacitance of each of the FETs illustrated in FIG. 4 form a capacitor divider to divide a voltage (e.g., high voltage RF signal) on Term 1 across each of the FETs in the shunt stack to the reference potential. The capacitor divider allows the shunt stack to handle a higher voltage than can be handled by just a single FET. For example, assuming a single FET breaks down at 3V, the capacity in terms of voltage handling before breakdown of the shunt stack is 18V (e.g., 6 FETs*3V) across the stack of FET devices, as compared to a breakdown at 3V when only using a single FET for isolation.

According to certain aspects, FIG. 4 illustrates a shunt termination path that can be used to provide a high impedance connection or a low impedance connection to a reference potential. For example, when the FETs in the shunt stack (e.g., FET1-FET6) are open based on Vg (e.g., biased OFF when Vg is low), they provide a high impedance connection to ground. When the FETs in the shunt stack are closed based on Vg (e.g., biased ON when Vg is high), they short out Term 2 and provide a low impedance connection to ground. According to certain aspects, the shunt path reduces the impedance of an input port, for example, by providing a low impedance path to ground, thereby increasing the isolation of these input ports.

Figure 5:
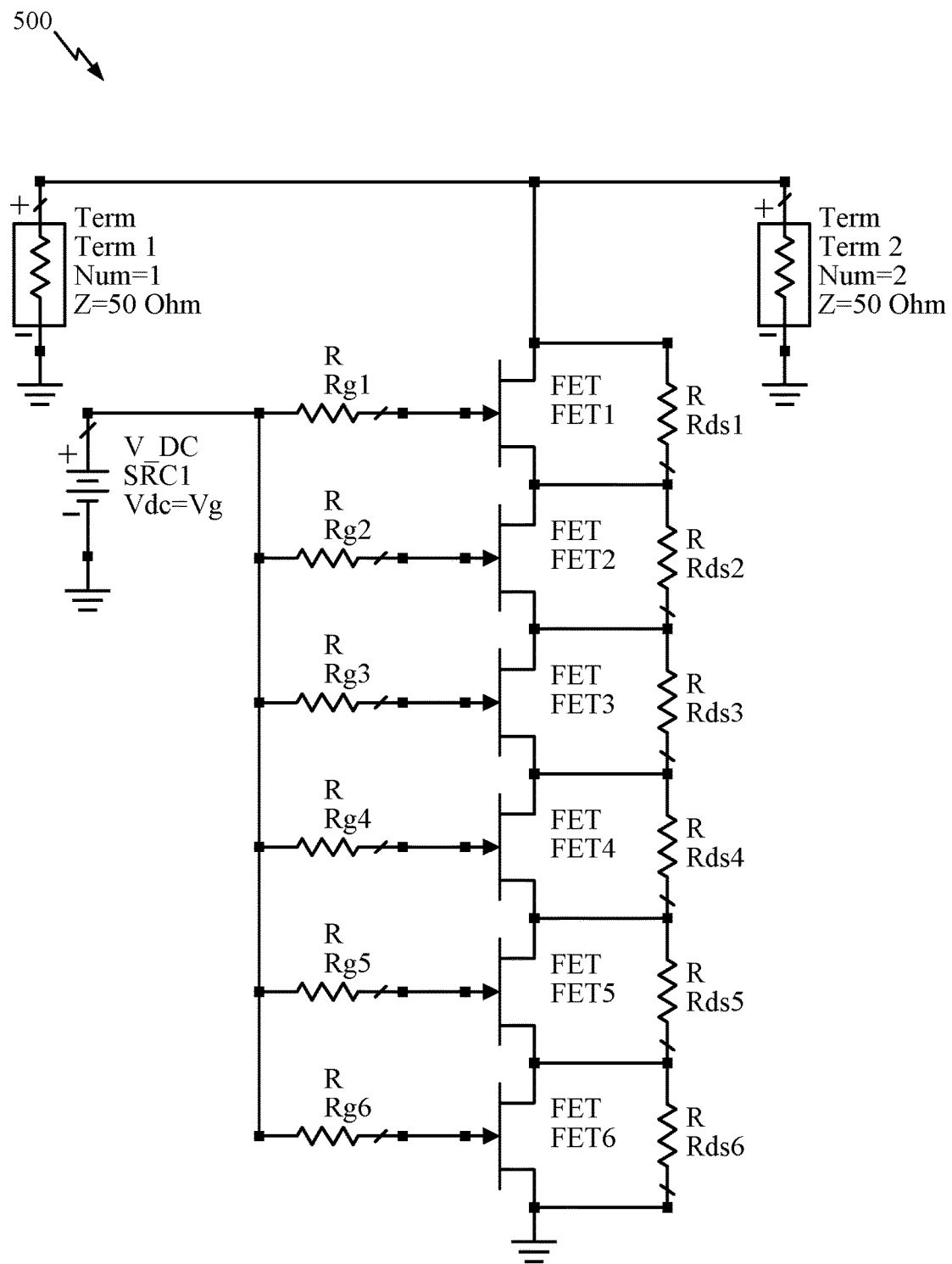
FIG. 5 illustrates a second shunt path circuit configuration for providing isolation between two terminals, in accordance with certain aspects of the present disclosure.

FIG. 5 illustrates a second shunt path circuit configuration for providing isolation between two terminals, according to certain aspects of the present disclosure. As shown, the shunt path circuit configuration illustrated in FIG. 5 is similar to the shunt path circuit configuration illustrated in FIG. 4. However, the shunt path circuit configuration illustrated in FIG. 5 further includes drain-to-source resistors ($R_{ds}$) on each of the FETs (e.g., FET1-FET6) in the shunt stack. In some cases, the values of these drain-to-source resistors may be selected such that $$R_{ds} \gg \frac{1}{(2*\pi*freq*C_{off})},$$

where freq is the frequency of the RF signal supplied, for example, by Term 1 and $C_{off}$ is the capacitance of the drain-to-source resistors' corresponding FET when turned off. According to certain aspects, these $R_{ds}$ resistors enable faster switching of the FETs and act as a charge bleed path when the FETs are open (e.g., biased OFF). For example, when the outside FETs of the shunt stack (e.g., FETs not coupled between two other FETs, such as, FET1 and FET6) are open (e.g., biased OFF), the inside FETs' (e.g., FETs coupled between two other FETs, such as, FET2-FET5) drain and source terminals may be held at ground potential to develop a gate-to-source voltage ($V_{gs}$) and gate-to-drain ($V_{gd}$) bias. The $R_{ds}$ resistors may couple the drain and source terminals of the FETs to ground to hold the drain and source terminal at ground potential.

Figure 6:
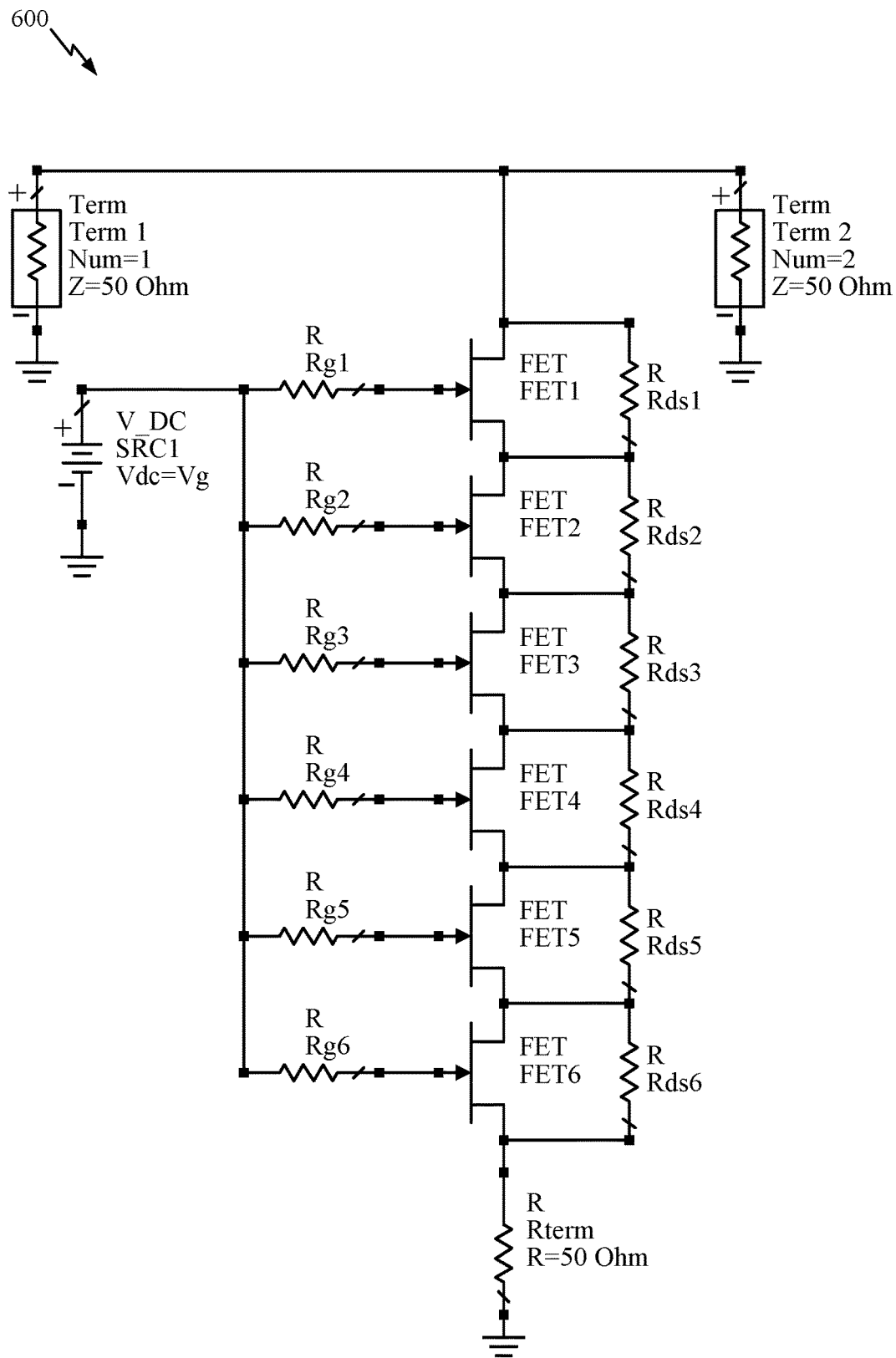
FIG. 6 illustrates a third shunt path circuit configuration for providing isolation between two terminals, in accordance with certain aspects of the present disclosure.

FIG. 6 illustrates a third shunt path circuit configuration for providing isolation between two terminals, according to certain aspects of the present disclosure. As shown, the shunt path circuit configuration illustrated in FIG. 6 is similar to the shunt path circuit configuration illustrated in FIG. 5. However, the shunt path circuit configuration illustrated in FIG. 6 further includes a termination resistor ($R_{term}$) coupled between the shunt stack and the reference potential (e.g., ground). When the FETs in the shunt stack are closed (e.g., biased ON), the $R_{term}$ resistor provides a terminating impedance between Term 1 and Term 2 (e.g., neglecting the ON resistance, $R_{ON}$, associated with the FETs). In some cases, when the $R_{term}$ resistor is used in series with the shunt stack (e.g., as shown in FIG. 6), and the FETs in the shunt stack are closed (e.g., biased ON), the $R_{term}$ resistor provides an "absorptive" termination state, which improves return loss on the isolated path between Term 1 and Term 2.

As can be seen in FIG. 6, the impedance associated with the shunt path including $R_{term}$ is fixed (e.g., based on the impedance of $R_{term}$) when the FETs in the shunt stack are closed (e.g., biased ON). The performance of $R_{term}$ may be critical in an electro static discharge (ESD) event. For example, during an ESD event, the FETs in the shunt stack may break down and the ESD current may flow heavily into $R_{term}$, potentially causing circuit failure. Therefore, $R_{term}$ may need to be designed to handle a large current in some implementations, and therefore, may be larger or more expensive when implementing the shunt path.

Figure 8:
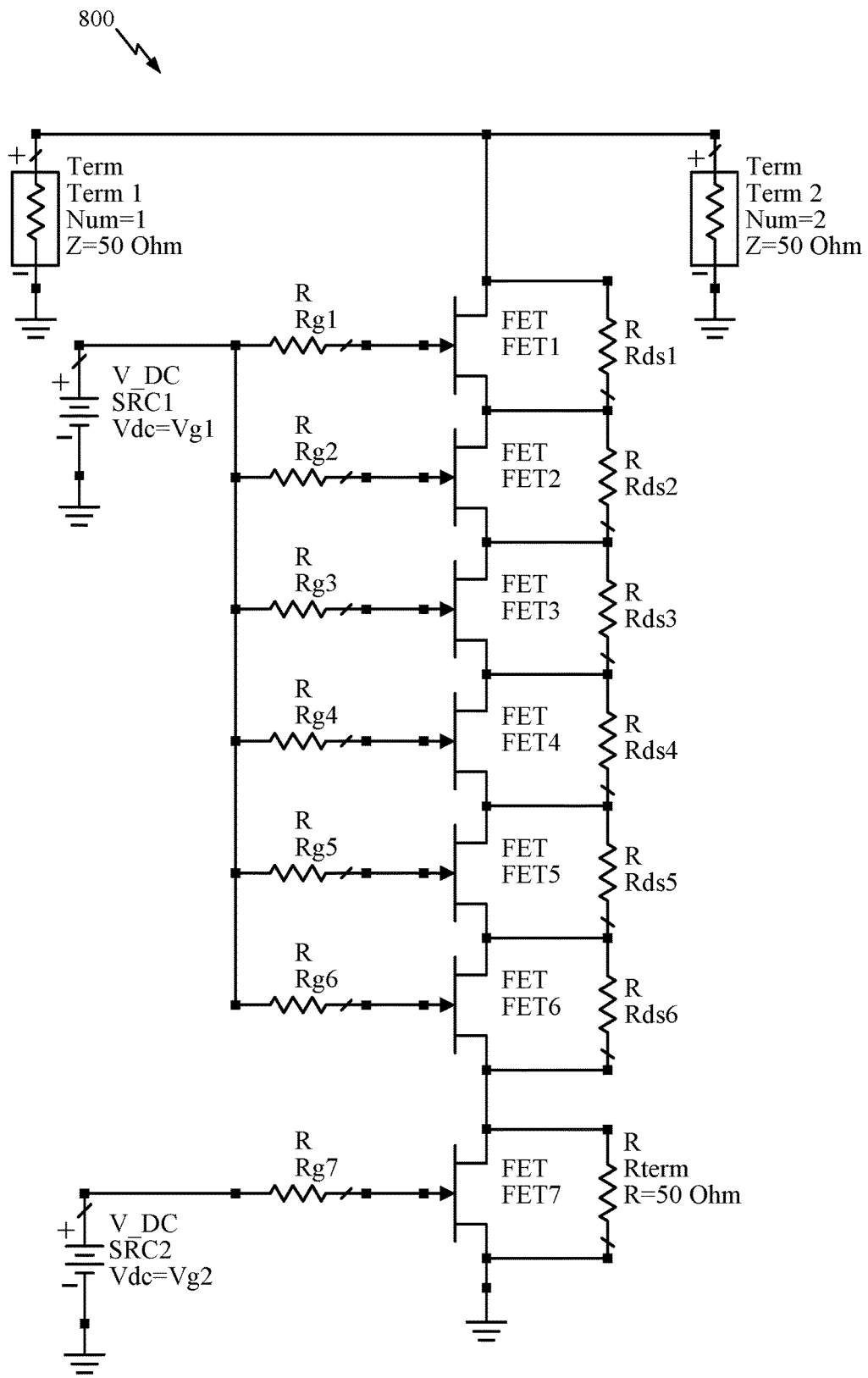
FIG. 8 illustrates a shunt path circuit configuration for providing isolation between two terminals, in accordance with certain aspects of the present disclosure.

Certain aspects of the present disclosure provide techniques for alleviating these issues. For example, certain aspects provide a shunt path circuit including a termination transistor (e.g., FET7 as illustrated in FIG. 8) in parallel with the termination resistor ($R_{term}$). Further, certain aspects provide for independently controlling a first bias voltage to the termination transistor from a second bias voltage to the FETs in the shunt stack to achieve different termination states (e.g., based on a desired termination state).

Figure 7:
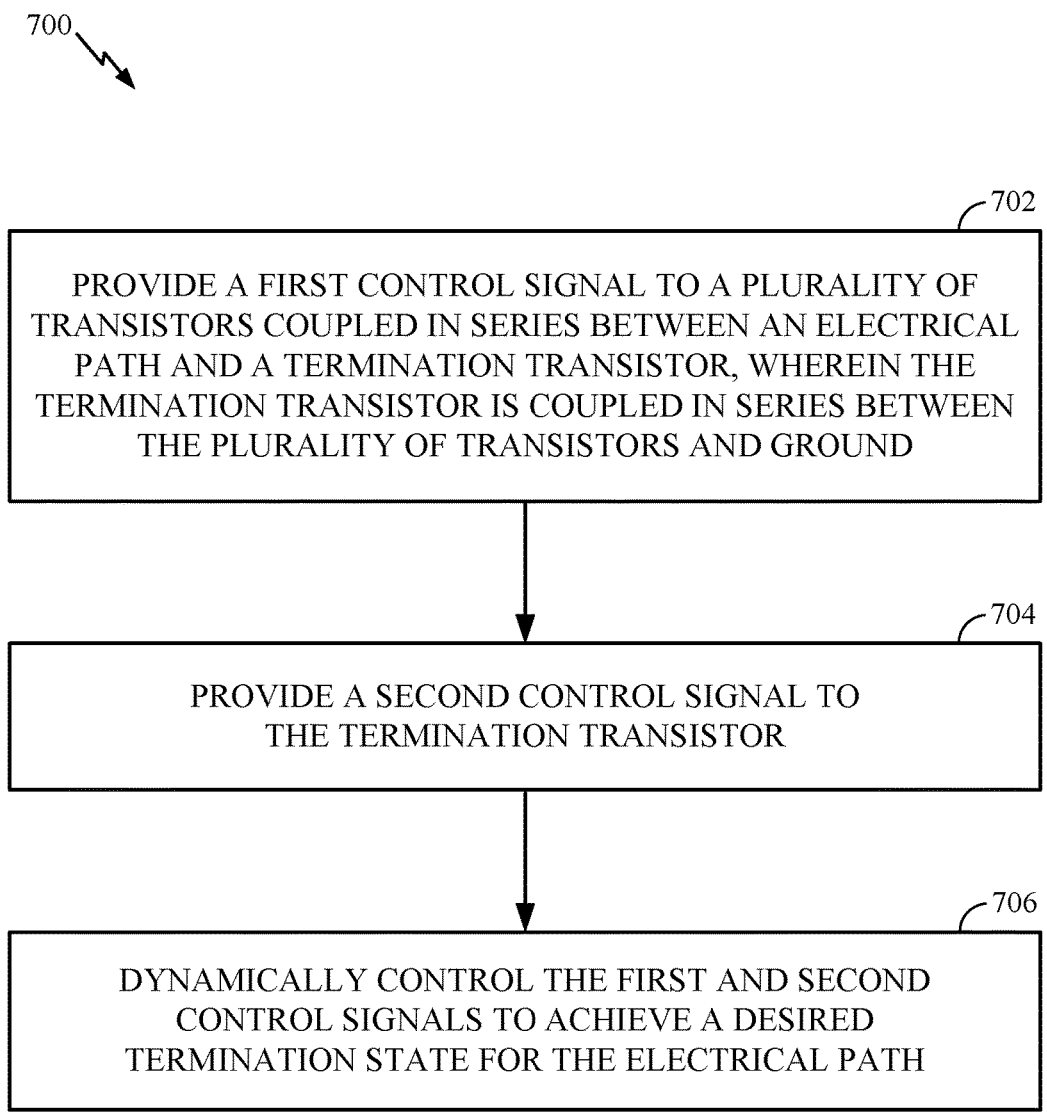
FIG. 7 is a flow diagram of example operations for operating an electrical circuit, in accordance with certain aspects of the present disclosure.

FIG. 7 illustrates example operations 700 for operating an electrical circuit (e.g., a shunt termination path) to provide different termination states for an isolated path. According to certain aspects, operations 700 may be performed by a wireless communications device, such as an access point (e.g., AP 110) and/or a user equipment (e.g., UE 120).

Operations 700 begin at 702 by providing a first control signal to a plurality of transistors coupled in series between an electrical path and a termination transistor, wherein the termination transistor is coupled in series between the plurality of transistors and ground. At 704, the wireless communications device provides a second control signal to the termination transistor. At 706, the wireless communications device dynamically controls the first and second control signals to achieve a desired termination state for the electrical path.

FIG. 8 illustrates a shunt path circuit configuration to which operations 700 correspond. The shunt path configuration may be used to provide isolation between two terminals in some implementations. As shown, the shunt path circuit configuration illustrated in FIG. 8 is similar to the shunt path circuit configuration illustrated in FIG. 6. However, to alleviate some of the issues associated with the shunt path circuit configuration in FIG. 6, the shunt path circuit configuration illustrated in FIG. 7 includes a termination transistor (e.g., FET7) in parallel with the termination resistor ($R_{term}$). In particular, the drain terminal of the termination transistor is coupled to a first terminal of $R_{term}$ and the source terminal of the termination transistor is coupled to a second terminal of $R_{term}$. Additionally, as shown, the gate terminal of the termination transistor FET7 is coupled to a gate resistor Rg7, which is further coupled to a different power source SRC2, than the power source SRC1 coupled to the FETs (e.g., FET1-FET6) of the shunt stack. In some aspects, the power for the different power sources SRC1 and SRC2 may come from different power supplies. In some aspects, the power for the different power sources SRC1 and SRC2 may come from the same power supply, but be separately controlled.

Accordingly, the termination transistor FET7 is coupled to a path with a different bias voltage Vg2, than the FETs (e.g., FET1-FET6) of the shunt stack, which are coupled to a path with a bias voltage Vg1. Accordingly, the opening and closing (e.g., biasing ON and OFF) of the termination transistor is controlled separately from the opening and closing (e.g., biasing ON and OFF) of the FETs (e.g., FET1-FET6) of the shunt stack. According to certain aspects, adding the termination transistor in parallel with the termination resistor, and separately controlling the termination transistor from the shunt stack, may provide an ESD bypass for the termination resistor. In particular, when the termination transistor is closed (e.g., biased ON), the termination transistor provides a path to ground parallel to the termination resistor, helping to prevent the effects of an ESD event passing through the termination resistor and potentially causing a circuit failure.

According to certain aspects, different termination states for the isolated path between Term 1 and Term 2 may be achieved by dynamically controlling Vg1 and Vg2. For example, a controller may generate control signals and provide the control signals to the power sources SRC1 and SRC2 that are used to supply power to/bias the FETs in the shunt stack (e.g., Vg1) and the termination FET (e.g., Vg2). For example, by opening FETs 1-6 (e.g., biasing the FETs 1-6 OFF when Vg1 is LOW) and closing FET 7 (e.g., biasing FET 7 ON when Vg2 is HIGH), the shunt stack Q-point or Q-factor may be improved. Additionally, when seeking a "short" to couple the isolated path between Term 1 and Term 2 to ground, FETs 1-6 and FET 7 may be closed (e.g., bias FETs 1-7 on when Vg1 and Vg2 are HIGH), which bypasses $R_{term}$ and shorts out the signal path between Term 1 and Term 2. When seeking an absorptive effect, FETs 1-6 may be closed (e.g, bias FET 1-6 ON) while FET 7 is opened (e.g., bias FET 7 OFF), directing a signal on the signal path between Term 1 and Term 2 to be absorbed in the termination resistor ($R_{term}$) and improving the return loss on the isolated path between Term 1 and Term 2. Additionally, FETs 1-6 and FET 7 may all be opened (e.g., biased OFF), for example, to achieve a high impedance coupling to ground. Controllable or adjustable sources of bias or control other than the power supplies SRC1 and SRC2 may be implemented according to embodiments described herein. These controllable or adjustable sources of bias or control may be used to supplement the power provided by SRC1 and/or SRCg2, and/or may be used in place of SRC1 and/or SRC2.

As noted, by independently controlling Vg1 and Vg2, different termination states may be achieved, for example, which may be used in various operating conditions. In other words, by dynamically controlling the power sources supplying power to the various FETs illustrated in FIG. 8, different desired termination states may be achieved, which improve the functioning of the wireless device employing the exemplary shunt termination path.

For example, the absorptive path described above (i.e., FETs 1-6 biased on and FET 7 biased off) is advantageous for broadband impedance control with unknown transmission line phase delay between switch and input port. Additionally, a reflective path (e.g., when the shunt path is seen as either a short circuit or an open circuit) provides higher Q termination (lower loss) to the input port thereby allowing more power to go to the intended path in a multiport switch. The transistors FET1-FET7 may therefore be selectively operated to achieve these configurations or while operating in a mode pursuant to these aspects.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for providing, means for dynamically controlling, and/or means for using may comprise one or more processors, such as the controller 230 of the access point 110 or the controller 280 of the user terminal 120.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, the term receiver may refer to an RF receiver (e.g., of an RF front end) or an interface (e.g., of a processor) for receiving structures processed by an RF front end (e.g., via a bus). Similarly, the term transmitter may refer to an RF transmitter of an RF front end or an interface (e.g., of a processor) for outputting structures to an RF front end for transmission (e.g., via a bus).

As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-Ray® Disc where Disks Usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of operating an electrical circuit, comprising:
providing a first control signal to a gate of each of a plurality of transistors coupled in series between an electrical path and a termination transistor, wherein a corresponding resistance is coupled between a source and a drain of each of the plurality of transistors, another resistance is coupled between a source and a drain of the termination transistor, the termination transistor is coupled in series between the plurality of transistors and ground, and the plurality of transistors and corresponding resistances and the termination transistor and corresponding other resistance form a configurable shunt between the electrical path and ground;
providing a second control signal to a gate of the termination transistor; and
dynamically and independently controlling the first and second control signals to configure the shunt to a desired termination state for the electrical path.

2. The method of claim 1, wherein:
a gate terminal of each of the plurality of transistors is coupled with a first power source; and
a gate terminal of the termination transistor is coupled with a second power source.

3. The method of claim 2, wherein:
the first control signal is provided to the plurality of transistors by the first power source; and
the second control signal is provided to the termination transistor by the second power source.

4. The method of claim 2, wherein a first gate resistor is coupled in between the gate terminal of each of the plurality of transistors and the first power source and a second gate resistor is coupled in between the gate terminal of the termination transistor and the second power source.

5. The method of claim 2, wherein dynamically controlling the first and second control signals comprises using the first power source to turn off the plurality of transistors and using the second power source to turn on the termination transistor.

6. The method of claim 2, wherein dynamically controlling the first and second control signals comprises using the first power source to turn on the plurality of transistors and using the second power source to turn on the termination transistor to provide a short between the electrical path and ground.

7. The method of claim 2, wherein dynamically controlling the first and second control signals comprises using the first power source and the second power source independently to achieve the desired termination state for the electrical path.

8. The method of claim 1 wherein desired termination states comprise at least one of a termination state that improves a Q-factor of the shunt path, a termination state that achieves an absorptive effect, or a termination state that achieves a short between the electrical path and ground, or a termination state that achieves a high impedance connection between the electrical path and ground.

9. An apparatus, comprising:
an electrical path;
a plurality of transistors coupled to the electrical path;
a corresponding plurality of resistors, each of the plurality of resistors coupled between a drain and a source of a corresponding one of the plurality of transistors,
a termination transistor;
a termination resistor coupled between a drain and a source of the termination transistor,
wherein the plurality of transistors and corresponding resistors are coupled in series between the electrical path and the termination transistor with corresponding termination resistor, and the termination transistor with corresponding termination resistor is coupled in series between the plurality of transistors and ground to form a configurable shunt;
a source of a first control signal configured to be selectively applied to gates of the plurality of transistors; and
a source of a second control signal configured to be selectively applied to a gate of the termination transistor, the first and second control signals being dynamically and independently controllable to achieve a desired termination state for the electrical path.

10. The apparatus of claim 9, wherein:
the gate terminal of each of the plurality of transistors is coupled with a first power source; and
the gate terminal of the termination transistor is coupled with a second power source.

11. The apparatus of claim 10, wherein:
the first control signal is provided to the plurality of transistors by the first power source; and
the second control signal is provided to the termination transistor by the second power source.

12. The apparatus of claim 10, wherein a first gate resistor is coupled in between the gate terminal of each of the plurality of transistors and the first power source and a second gate resistor is coupled in between the gate terminal of the termination transistor and the second power source.

13. The apparatus of claim 10, further comprising a control module configured to dynamically control the first and second control signals by using the first power source to turn off the plurality of transistors and using the second power source to turn on the termination transistor.

14. The apparatus of claim 10, further comprising a control module configured to dynamically control the first and second control signals by using the first power source to turn on the plurality of transistors and using the second power source to turn on the termination transistor to provide a short between the electrical path and ground.

15. The apparatus of claim 10, further comprising a control module configured to dynamically control the first and second control signals by using the first power source and the second power source independently to achieve the desired termination state for the electrical path.

16. The apparatus of claim 9, wherein desired termination states comprise at least one of a termination state that improves a Q-factor of the shunt path, a termination state that achieves an absorptive effect, or a termination state that achieves a short between the electrical path and ground, or a termination state that achieves a high impedance connection between the electrical path and ground.

17. An apparatus for operating an electrical circuit, comprising:

means for providing a first control signal to a plurality of transistors coupled in series between an electrical path and a termination transistor, each of the plurality of transistors and the termination transistor being coupled across a corresponding resistance, wherein the termination transistor with corresponding resistance is coupled in series between the plurality of transistors with corresponding resistances and ground to form a configurable shunt;

means for providing a second control signal to the termination transistor; and means for dynamically and independently controlling the first and second control signals to achieve a desired termination state for the electrical path.

18. The apparatus of claim 17, wherein:
a gate terminal of each of the plurality of transistors is coupled with a first means for providing power; and
a gate terminal of the termination transistor is coupled with a second means for providing power.

19. The apparatus of claim 18, wherein:
the first control signal is provided to the plurality of transistors by the first means for providing power; and
the second control signal is provided to the termination transistor by the second means for providing power.

20. The apparatus of claim 18, wherein the means for dynamically controlling the first and second control signals are configured to use the first means for providing power and the second means for providing power independently to achieve the desired termination state for the electrical path.

21. The apparatus of claim 17, wherein desired termination states comprise at least one of a termination state that improves a Q-factor of a shunt path of the electrical circuit, a termination state that achieves an absorptive effect, or a termination state that achieves a short between the electrical path and ground, or a termination state that achieves a high impedance connection between the electrical path and ground.

22. A switch, comprising:
a stack of transistors in shunt with a signal path;
a plurality of resistors, each resistor being coupled between a source and a drain of a respective transistor in the stack of transistors; and
a selectively bypassable terminating impedance coupled between the stack of transistors and ground, the terminating impedance being selectively bypassable independent of any control of the stack of transistors.

23. The switch of claim 22, wherein the terminating impedance comprises a first resistor configured to provide a terminating impedance when the transistors in the stack of transistors are on.

24. The switch of claim 23, further comprising a first transistor, wherein the first resistor is coupled between a source and drain of the first transistor.

25. The switch of claim 24, wherein gates of the transistors in the stack of transistors are coupled to a first control, and wherein a gate of the first transistor is coupled to a second control.

26. The switch of claim 24, wherein the first transistor has a higher impedance than the first resistor when the first transistor is off and the transistors in the stack of transistors are on.

* * * * *